United States Patent
Ohashi et al.

(10) Patent No.: US 11,387,401 B2
(45) Date of Patent: Jul. 12, 2022

(54) ORIENTED PIEZOELECTRIC FILM, METHOD OF MANUFACTURING THE SAME AND PIEZOELECTRIC ELEMENT

(71) Applicant: CANON KABUSHIKI KAISHA, Tokyo (JP)

(72) Inventors: Yoshihiro Ohashi, Tokyo (JP); Yoshinori Kotani, Yokohama (JP); Motokazu Kobayashi, Yokohama (JP)

(73) Assignee: Canon Kabushiki Kaisha, Tokyo (JP)

(*) Notice: Subject to any disclaimer, the term of this patent is extended or adjusted under 35 U.S.C. 154(b) by 386 days.

(21) Appl. No.: 16/587,900

(22) Filed: Sep. 30, 2019

(65) Prior Publication Data
US 2020/0111946 A1    Apr. 9, 2020

(30) Foreign Application Priority Data

Oct. 3, 2018  (JP) .............................. JP2018-188389

(51) Int. Cl.
| H01L 41/187 | (2006.01) |
| H01L 41/08 | (2006.01) |
| B41J 2/16 | (2006.01) |
| B41J 2/14 | (2006.01) |

(52) U.S. Cl.
CPC ...... *H01L 41/0805* (2013.01); *B41J 2/14201* (2013.01); *B41J 2/161* (2013.01); *H01L 41/1871* (2013.01)

(58) Field of Classification Search
CPC .............. H01L 41/0805; H01L 41/1871; B41J 2/14201; B41J 2/161; C04B 2235/3236; C04B 2235/441; C04B 35/4686; C04B 35/624
See application file for complete search history.

(56) References Cited

U.S. PATENT DOCUMENTS

| 9,496,484 B2* | 11/2016 | Ueda ................... B41J 2/14201 |
| 10,074,796 B2* | 9/2018 | Ueda ................... B41J 2/14274 |
| 10,811,592 B2* | 10/2020 | Kubota ................. H02N 2/106 |
| 11,038,440 B2* | 6/2021 | Ueda ................... H01L 41/0477 |
| 2014/0152144 A1* | 6/2014 | Watanabe ........... H01L 41/1871 252/62.9 PZ |
| 2020/0108607 A1* | 4/2020 | Kotani ................ H01L 41/0805 |

OTHER PUBLICATIONS

Yu-Ichi Hamazaki et al., "Effects of BaTiO3 Content and Mn Doping on Ferroelectric Properties of NaNbO3—BaTiO3 Thin Films Prepared by Chemical Solution Deposition" Japanese Journal of Applied Physics, 48 (2009), 09KA08-1-09KA08-5.

* cited by examiner

*Primary Examiner* — J. San Martin
(74) *Attorney, Agent, or Firm* — Canon U.S.A., Inc., IP Division

(57) ABSTRACT

An oriented piezoelectric film comprises perovskite type crystals expressed by formula (1) shown below:

$$(1-x)NaNbO_3\text{-}xBaTiO_3 \ (0.01 \leq x \leq 0.40) \quad (1)$$

and (111) oriented in pseudocubic crystal notation.

3 Claims, 8 Drawing Sheets

ORIENTED PIEZOELECTRIC FILM, METHOD OF MANUFACTURING THE SAME AND PIEZOELECTRIC ELEMENT

BACKGROUND OF THE INVENTION

Field of the Invention

The present disclosure relates to an oriented piezoelectric film and a method of manufacturing the same. This disclosure also relates to a piezoelectric element having such a piezoelectric film.

Description of the Related Art

In recent years, there has been and still is a demand for lead-free dielectric thin films from the viewpoint of avoiding putting an increased load on the environment of this planet by various wastes of electronic devices produced by using lead-containing dielectric thin film. The so-called sol-gel process that allows precision control of complex film compositions and homogeneous application of such film onto large area substrates has been attracting attention. Thin films based on sodium (=natrium) niobate (NN)-barium titanate (BT) (to be also referred to as NNBT film hereinafter) have been proposed as lead-free dielectric thin films. See, inter alia, "Effects of $BaTiO_3$ Content and Mn Doping on Ferroelectric Properties of $NaNbO_3$—$BaTiO_3$ Thin Films Prepared by Chemical Solution Deposition" (Non-Patent Literature 1).

Actuators of inkjet recording heads have been known as suitable applications of such dielectric thin films, although a large dielectric constant is required for such dielectric thin films to feasibly be employed for such applications. Generally, a highly oriented thin film tends to show a large piezoelectric constant and therefore dielectric thin films, which are to be formed by way of a film forming process including material application, temporary baking and baking, are required to be highly oriented if they are to be used for such actuator applications.

However, thin films prepared by way of a film forming process using a coating liquid described in the above-cited Non-Patent Literature 1 are randomly oriented and hence it is not possible to reliably obtain highly oriented thin films by means of the technique described in the Non-Patent Literature.

SUMMARY OF THE INVENTION

According to the present disclosure, there is provided an oriented piezoelectric film comprising perovskite type crystals expressed by formula (1) shown below:

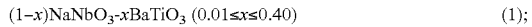

$$(1-x)NaNbO_3\text{-}xBaTiO_3 \ (0.01 \le x \le 0.40) \tag{1}$$

wherein the oriented piezoelectric film is (111) oriented in pseudocubic crystal notation, the abundance ratio of (111) orientation as observed by the electron backscatter diffraction (EBSD) method being not less than 80% on the film surface, the angular dispersion of (111) orientation being within 5 degrees in the inverse pole figure in the normal direction of the film.

Further features of the present disclosure will become apparent from the following description of exemplary embodiments with reference to the attached drawings.

BRIEF DESCRIPTION OF THE DRAWINGS

FIG. 1A is an SEM surface image of the film obtained in Example 1 and FIG. 1B is an inverse pole figure of the film, while

DESCRIPTION OF THE EMBODIMENTS

An aspect of the present disclosure is to provide a (111) oriented NNBT film and a method of manufacturing such a film. Now, the present disclosure will be described in greater detail by way of currently preferable embodiments.

An oriented piezoelectric film according to the present disclosure comprises perovskite type crystals expressed by formula (1) shown below:

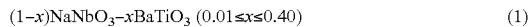

$$(1-x)NaNbO_3\text{-}xBaTiO_3 \ (0.01 \le x \le 0.40) \tag{1};$$

and is characterized in that the oriented piezoelectric film is (111) oriented in pseudocubic crystal notation. The crystal structure of the sodium niobate-barium titanate-based film is rhombohedral, orthorhombic, tetragonal or cubic or the sodium niobate-barium titanate-based film can simultaneously take more than one of these crystal structures depending on its composition. However, for the purpose of simple notation, the sodium niobate-barium titanate-based film is dealt as pseudo cubic in this specification unless noted otherwise.

Additionally and preferably, the abundance ratio of (111) orientation of an oriented piezoelectric film according to the present disclosure as observed by the electron backscatter diffraction (EBSD) method is not less than 80% on the film surface and the angular dispersion of (111) orientation is within 5 degrees in the inverse pole figure in the normal direction of the film.

Furthermore, preferably, the dispersion of the abundance ratio of (111) orientation of an oriented piezoelectric film according to the present disclosure is not more than 20% both on the film surface and on the film initial layer side while the average grain size on the film surface is between 50 and 1,000 nm and the film thickness is between 100 and 3,000 nm. An oriented piezoelectric film according to the present disclosure can be formed without any crack when the film thickness does not exceed 3,000 nm but gives rise to one or more cracks to make itself electrically conductive to the lower electrode when the film thickness exceeds 3,000 nm. On the other hand, an oriented piezoelectric film according to the present disclosure loses its piezoelectric property when the film thickness is less than 100 nm. Therefore, the film thickness of an oriented piezoelectric film according to the present disclosure is preferably between 100 and 3,000 nm.

The expression of "grain size" as used in this specification refers to the diameter of the circle circumscribed to the projected figure of each crystal grain (columnar grains or random grains) as projected from a position located above the film. The expression of "average grain size" refers to the average value of the grain sizes of the crystal grains of the film.

<Piezoelectric Element>

Figure 5:
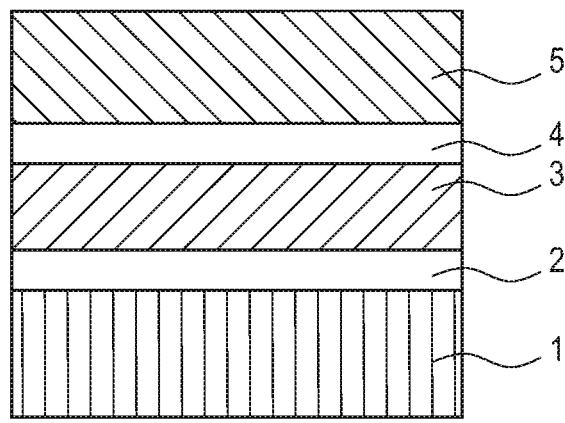
FIG. 5 is a schematic cross-sectional view of a piezoelectric actuator, which is an embodiment of the present disclosure.

FIG. 5 shows a schematic longitudinal cross-sectional view of an embodiment of piezoelectric element according to the present disclosure. In FIG. 5, 1 denotes a base substrate that supports a piezoelectric film, 2 denotes an intermediate layer and 3 denotes a lower electrode, while 4 denotes an orientation control layer and 5 denotes a piezoelectric layer.

The material of the base substrate 1 includes $SiO_2$ contained at least in the uppermost surface layer thereof. Otherwise, the material preferably is free from deformation and melting when subjected to a thermal load in a drying step that comes after a coating step. Additionally and preferably, the base substrate 1 shows a smooth surface and a satisfactory level of mechanical strength and can prevent any diffusion of elements during a heat treatment.

When manufacturing a liquid ejection head by using a piezoelectric thin film that can be obtained by an embodiment of the present disclosure, the base substrate 1 may be made to operate also as a vibration plate of pressure chambers to be used to form the pressure chambers. For such a purpose, for example, a silicon (Si) semiconductor substrate that is made to have an $SiO_2$ surface layer by thermal oxidation can preferably be employed, although a ceramic substrate of zirconia, alumina, silica or the like may alternatively be employed. So long as the substrate is made to have an $SiO_2$ uppermost surface layer, two or more of these materials may be combined and used to form the substrate or two or more of these materials may be laid one on the other to make the substrate show a multilayer structure.

The intermediate layer 2 is a layer that operates to make the underlying $SiO_2$ layer and the upper electrode tightly stick to each other. When only Pt, which is a metal, and $SiO_2$, which is an oxide, are involved and no intermediate layer is employed, the net result will be that not only they would not tightly stick to each other but also they adversely affect the crystallinity of the electrode and that of the piezoelectric layer to be formed thereon to make it impossible to realize an excellent piezoelectric property. On the other hand, an exceedingly thick intermediate layer can be disadvantageous. More specifically, when the thickness of the intermediate layer exceeds 50 nm, the crystallinity of the upper piezoelectric layer tends to be deteriorated. In other words, the thickness of the intermediate layer 2 is preferably between 5 and 50 nm. The material of the intermediate layer is preferably Ti or an oxide of Ti, which may typically be $TiO_2$.

The lower electrode 3 is an electro-conductive layer having a thickness between 5 and 2,000 nm. Materials that can be used for the lower electrode 3 of an piezoelectric element normally include metals such as Ti, Pt, Ta, Ir, Sr, In, Sn, Au, Al, Fe, Cr and Ni and oxides of such metals. There are several techniques such as sol-gel, sputtering and evaporation that can be used for producing the electrode, of which sputtering is most preferable because it does not require the use of high temperatures for forming the electrode. While the thickness of the electrode is not subject to any particular limitations so long as the selected thickness ensures a satisfactory level of electro-conductivity, the thickness is desirably between 10 and 1,000 nm. The obtained electrode may be subjected to a patterning process to so as to make it show a desired profile. Note that a perfectly (111) oriented film is obtained when the electrode is formed by sputtering Pt.

The orientation control layer 4 is a layer for controlling the orientation of the piezoelectric layer that is laid on it. It also takes the role of minimizing the diffusion of the elements of the thin piezoelectric film layer toward the electrode side that can be caused by the thermal load produced as a result of the heat treatment for forming the thin film. Additionally, while Ti in the intermediate layer that is located between the lower electrode and the substrate also tends to be diffused by the thermal load toward the electrode and the piezoelectric thin film, the orientation control layer 4 that is sandwiched between the lower electrode 3 and the piezoelectric layer 5 also takes the role of minimizing the diffusion of Ti. The thickness of the orientation control layer 4 is preferably between 5 and 100 nm. However, the orientation control layer 4 may be omitted if it adversely affects the orientation control of the piezoelectric film because the orientation of the piezoelectric thin film layer is controlled by the orientational property of the lower electrode 3.

As for the material of the piezoelectric layer 5, the piezoelectric layer 5 is a film based on sodium niobate-barium titanate expressed by the above-described formula (1).

<Manufacturing of Oriented Piezoelectric Film>

A method of manufacturing an oriented piezoelectric film according to the present disclosure comprises:

(1) a step of applying a coating liquid composition containing a raw material compound of metal oxides expressed by the above-described formula (1);

(2) a step of drying the applied coating liquid composition at temperatures between 100 and 200° C.;

(3) a step of forming a coating film by way of temporarily baking at temperatures higher than 200° C. and not higher than 700° C.; and (4) a step of baking the coating film formed by way of the temporary baking, at temperatures exceeding 700° C.

Then, an oriented piezoelectric film can be obtained as a result of the above-described manufacturing steps.

Preferably, the steps (1) through (3) are executed repeatedly until the film thickness of the coating film is made to grow to less than 200 nm and the temporary baking step of (3) is executed at temperatures not lower than 300° C. and lower than 500° C. It is also preferable that the steps (1) through (3) are executed repeatedly until the film thickness of the coating film is found to be between 200 and 500 nm and the temporary baking step of (3) is executed at temperatures between 500 and 700° C. A (111) oriented piezoelectric film can be obtained by repeatedly executing the above-described steps (1) through (3).

When forming a coating film on the substrate by means of the above-described coating liquid composition, the atmosphere in which the operation of applying the coating liquid composition is executed is preferably a dry air atmosphere or an inactive gas atmosphere such as a dry nitrogen atmosphere. The relative humidity of the dry atmosphere is preferably made to be not higher than 30%.

Any known application technique can appropriately be used to apply the coating liquid composition for the purpose of forming a coating film. Known techniques that can be used for the purpose of the present disclosure include dipping, spin coating, spraying, printing, flow coating and a combination of two or more of the above-listed techniques. When a dipping technique is employed, the film thickness can be controlled by selecting an appropriate lifting rate.

When a spin coating technique is employed, the film thickness can be controlled by selecting an appropriate substrate rotation rate. Additionally, the film thickness can also be controlled by selecting an appropriate concentration for the coating solution.

While the substrate to be used for forming an oriented piezoelectric film according to the present disclosure may vary depending on the application thereof, a heat-resistant substrate such as a silicon substrate or a sapphire substrate having a lower electrode formed thereon will typically be employed for the purpose of the present disclosure. Materials that can be used for the lower electrode to be formed on the substrate are electro-conductive materials that do not react with an oriented piezoelectric film according to the present disclosure. Examples of such materials include Pt, Ir and Ru. Alternatively, a substrate having a lower electrode formed thereon with an adhesive layer and/or an insulating film interposed between the substrate and the lower electrode can be used. Specific examples of such substrates include those having a laminated structure (lower electrode/ adhesive layer/insulating film/substrate) such as Pt/Ti/SiO$_2$/ Si, Pt/TiO$_2$/SiO$_2$/Si, Pt/IrO/Ir/SiO$_2$/Si, Pt/TiN/SiO$_2$/Si, Pt/Ta/SiO$_2$/Si and Pt/Ir/SiO$_2$/Si.

After forming a coating film on the substrate, the coating film is dried. Then, a crystallized film is obtained by way of a film forming process including drying the coating film, subsequently temporarily baking and then properly baking the coating film. According to the present disclosure, a (111) oriented, highly orientational NNBT film can be obtained by way of a film forming process of controlling the coordination state of the stabilizer to be used for controlling the hydrolysis/condensation polymerization reaction of metal alkoxide and realizing an epitaxial growth with a base member such as a (111) oriented Pt electrode.

The drying step is executed by means of a hot plate or the like at temperatures between 100 and 200° C. for a time period between 1 and 5 minutes specifically in order to eliminate the low boiling point components and the adsorbed water molecules.

The temporary baking step is executed by means of a hot plate or a focused infrared heater (RTA) under predetermined conditions. The temporary baking step is executed in order to eliminate the solvent and turn the metal compounds into composite oxides by way of pyrolysis or hydrolysis and hence this step is desirably executed in the air, in an oxidizing atmosphere or in a steam-containing atmosphere. If the coating liquid composition is heated in the air, the amount of water molecules necessary for the hydrolysis of the composition can satisfactorily be secured by the moisture in the air. The temporary baking step is preferably executed at temperatures between 200 and 700° C. for a time period between 1 and 10 minutes.

When the desired film thickness can be obtained by applying the coating liquid composition only once, the processes from the composition applying step through the temporary baking step are executed only once prior to the execution of the baking step. If, on the other hand, the desired film thickness cannot be obtained by a single execution of the application step, the processes from the application step through the temporary baking step may be executed for several times and then finally the baking step is executed once.

The baking step is a step of baking the temporarily baked coating film at temperatures not lower than the crystallization temperature of the coating film. Then, an oriented piezoelectric film according to the present disclosure is obtained as a result of the execution of this step. An O$_2$, N$_2$, Ar, N$_2$O or H$_2$ atmosphere or an atmosphere of a mixture gas of any two or more of the above-listed gases can suitably be used for the baking atmosphere of this crystallization step. The baking step is executed at temperatures in a temperature range between higher than 700° C. and 1,100° C. for a time period between 1 and 60 minutes. A rapid thermal annealing process may be used for the baking step. The temperature rise from the room temperature to the above-defined baking temperature is preferably realized at a rate of 10 to 100° C./sec.

The inventors of the present disclosure assume that the theory that will be described below applies to the orientation mechanism of a piezoelectric film, although they are not necessarily bound by the theory. Firstly, the inventors believe that the timing of detachment of the stabilizer from the metal alkoxide and the crystal nucleation stage influences the orientation of the film. More specifically, the stabilizer can be detached with ease when the coordination ability of the stabilizer contained in the coating liquid composition to be used for the purpose of the present disclosure is low. Then, for this reason, crystal nucleation is encouraged to proceed in the crystal nucleation stage that accompanies the film baking process so that epitaxial orientation takes place to the film along the (111) plane of the Pt electrode or the like of the base substrate.

<Preparation of Sodium Niobate-Barium Titanate-Based Coating Liquid Composition>

A coating liquid composition to be used for the purpose of the present disclosure contains (a) a sol-gel raw material containing (i) through (iv) metal components as listed below and (b) a β-ketoester compound.

(i) at least a niobium component selected from a group consisting of niobium alkoxides, hydrolysates of niobium alkoxides and condensates of hydrolysates of niobium alkoxides;

(ii) at least a sodium component selected from a group consisting of sodium alkoxides, hydrolysates of sodium alkoxides and condensates of hydrolysates of sodium alkoxides;

(iii) a titanium component selected from a group consisting of titanium alkoxides, hydrolysates of titanium alkoxides and condensates of hydrolysates of titanium alkoxides; and (iv) at least a barium component selected from a group consisting of barium alkoxides, hydrolysates of barium alkoxides and condensates of hydrolysates of barium alkoxides.

In addition to alkoxides of the above listed metals, salts of any of the above-listed metals such as chlorides, nitrates and so on of any of the above-listed metals can be used for the raw material of the sodium niobate-barium titanate-based coating liquid composition. The use of such metal alkoxides as listed above for the raw material is preferable from the viewpoint of stability of the coating liquid and film homogeneity at the time of preparing the coating film.

Specific examples of niobium alkoxides include niobium penta-methoxide, niobium penta-ethoxide, niobium penta-i-propoxide, niobium penta-n-propoxide, niobium penta-i-butoxide and niobium penta-n-butoxide. Specific examples of sodium alkoxides include sodium methoxide, sodium ethoxide, sodium i-propoxide, sodium n-propoxide, sodium i-butoxide, sodium n-butoxide and sodium sec-butoxide.

Specific examples of titanium alkoxides include titanium tetra-methoxide, titanium tetra-ethoxide, titanium tetra-n-propoxide, titanium tetra-iso-propoxide, titanium tetra-n-butoxide and titanium tetra-iso-butoxide. Specific examples of barium alkoxides include barium di-methoxide, barium di-ethoxide, barium di-i-propoxide, barium di-n-propoxide, barium di-i-butoxide, barium di-n-butoxide and barium di-sec-butoxide.

For the purpose of the present disclosure, the composition ratio of the sodium niobate component and the barium titanate component is desirably between 0.99:0.01 and 0.60:0.40 in terms of molar ratio. The ratio of niobium and sodium in the sodium niobate is between 1:0.8 and 1:1.2, preferably between 1:0.9 and 1:1.1. Similarly, the ratio of titanium and barium in the barium titanate is between 1:0.8 and 1:1.2, preferably between 1:0.9 and 1:1.1.

As the raw material of metal alkoxides as described above is employed, they are fiercely hydrolyzed by the moisture in the surrounding air and the added water to make the solution cloudy and give rise to precipitates because they are highly reactive to water. Therefore, a stabilizer is preferably added to stabilize the solution and prevent such a phenomenon of hydrolysis from taking place. Examples of stabilizers include β-ketoester compounds such as methyl acetoacetate, ethyl acetoacetate, aryl acetoacetate, benzyl acetoacetate, iso-propyl acetoacetate, tert-butyl acetoacetate, iso-butyl acetoacetate and 2-methoxyethyl acetoacetate. The use of acetyl acetone, which is a β-diketone compound, is not preferable from the viewpoint of orientation of the obtained film, although it is effective from the viewpoint of stability. The stabilizer is to be added by 0.1 to 3, preferably by 0.5 to 2, in terms of molar ratio, relative to the metal alkoxides.

The stability of the coating liquid composition can be raised by adding the above-identified stabilizer in the above-described manner. The β-ketoester compound that operates as stabilizer is believed to be coordinately bonded to the metal elements of the metal alkoxides and hence a coating liquid composition according to the present disclosure is characterized by containing precursors of metal alkoxides of niobium, sodium, titanium or barium in which the stabilizer is in a state of being coordinately bonded to the metals of the metal alkoxides.

A coating liquid composition is prepared by dissolving the metal alkoxides and the stabilizer as described above into an organic solvent. Preferably, the organic solvent is added by such an amount that the molar quantity of the added organic solvent is 20 to 30 times of the total molar quantity of the metal alkoxides.

Organic solvents that can be used for the purpose of the present disclosure include alcohols, carboxylic acids, aliphatic and alicyclic hydrocarbons, aromatic hydrocarbons, esters, ketones, ethers, chlorinated hydrocarbons, aprotic polar solvents and mixed solvents of two or more of the above-cited different solvent types.

Preferable examples of alcohols that can be used for the solvent include methanol, ethanol, 2-propanol, butanol, 2-methoxyethanol, 2-ethoxyethanol, 1-methoxy-2-propanol, 1-ethoxy-2-propanol, 1-propoxy-2-propanol, 4-methyl-2-pentanol, 2-ethylbutanol, 3-methoxy-3-methylbutanol, ethylene glycol, diethylene glycol and glycerin.

Preferable examples of carboxylic acids include n-butyric acid, α-methyl butyric acid, i-valeric acid, 2-ethyl butyric acid, 2,2-dimethyl butyric acid, 3,3-dimethyl butyric acid, 2,3-dimethyl butyric acid, 3-methyl pentanic acid, 4-methyl pentanic acid, 2-ethyl pentanic acid, 3-ethyl pentanic acid, 2,2-dimethyl pentanic acid, 3,3-dimethyl pentanic acid, 2,3-dimethyl pentanic acid, 2-ethyl hexanoic acid and 3-ethyl hexanoic acid.

Preferable examples of aliphatic and alicyclic hydrocarbons include n-hexane, n-octane, cyclohexane, cyclopentane and cyclooctane. Preferable examples of aromatic hydrocarbons include toluene, xylene and ethyl benzene.

Preferable examples of esters include ethyl formate, ethyl acetate, n-butyl acetate, ethylene glycol monomethyl ether acetate, ethylene glycol monoethyl ether acetate and ethylene glycol monobutyl ether acetate. Preferable examples of ketones include acetone, methyl ethyl ketone, methyl isobutyl ketone and cyclohexanone. Preferable examples of ethers include dimethoxy ethane, tetrahydrofuran, dioxane and diisopropyl ether.

Preferable examples of chlorinated hydrocarbons include chloroform, methylene chloride, carbon tetrachloride and tetrachloroethane. Examples of aprotic polar solvents that can be used for the purpose of the present disclosure include N-methyl pyrrolidone, dimethyl formamide, dimethyl acetoamide and ethylene carbonate.

When preparing a coating solution to be used for the purpose of the present disclosure, the use of an alcohol out of the above-listed various solvents is preferable from the viewpoint of stability of the solution.

A method of manufacturing a sodium niobate-barium titanate-based coating liquid composition according to the present disclosure comprises:

a step of preparing a first preparation liquid by adding a β-ketoester compound stabilizer to an organic solvent; and a step of adding metal alkoxides of niobium, sodium, titanium and barium to the first preparation liquid and refluxing the mixture. More specifically, as the method of preparing a coating liquid composition, for example, metal alkoxides as defined above are mixed with a solution prepared by adding a stabilizer to an organic solvent as defined above and subsequently the mixture solution is heated to temperatures in the temperature range between 80 and 200° C. for 2 to 10 hours to make them react with each other and hence the mixture solution is refluxed.

Whenever necessary, water and/or a catalyst is added to the mixture to partially hydrolyze the alkoxide groups in advance. Examples of catalysts that can be added to the mixture include nitric acid, hydrochloric acid, sulfuric acid, phosphoric acid, acetic acid and ammonia. In other words, a coating liquid composition according to the present disclosure may contain hydrolysates of metal alkoxides and condensates of such hydrolysates. Whenever necessary, one or more water-soluble organic polymers can be added to a coating liquid composition according to the present disclosure. Examples of such organic polymers include polyethylene glycol, polypropylene glycol and polyvinyl pyrrolidone. Such one or more organic polymers are added to the coating liquid composition by such an amount within a range between 0.1 and 10 mass % of the oxides of the film.

<Liquid Ejection Head>

A liquid ejection head according to the present disclosure comprises liquid ejection orifices, pressure chambers held in communication with the respective liquid ejection orifices and actuators for causing the respective pressure chambers to change their volumes in order to eject liquid from the liquid ejection orifices, each of the actuators including a vibration plate which is commonly shared by all the actuators, a lower electrode, a piezoelectric film formed on a substrate by using an NNBT film and an upper electrode arranged in the above-described order as viewed from the pressure chamber side.

Figure 6:
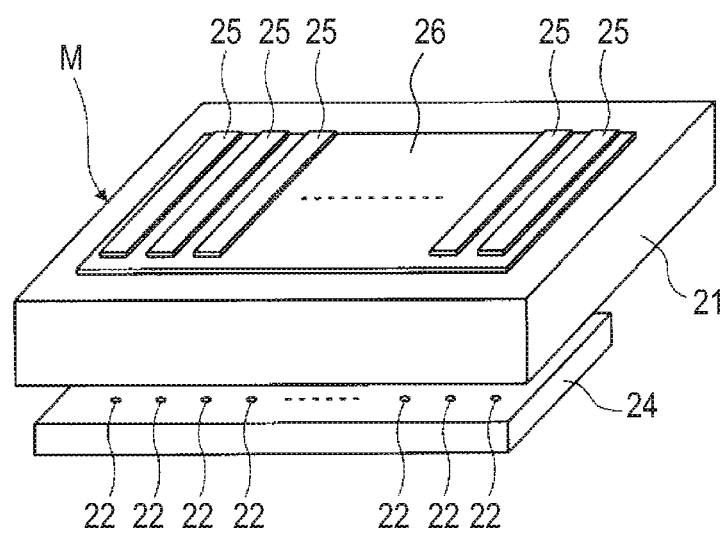
FIG. 6 is a schematic perspective view of a liquid ejection head, which is an embodiment of the present disclosure.
Figure 7:
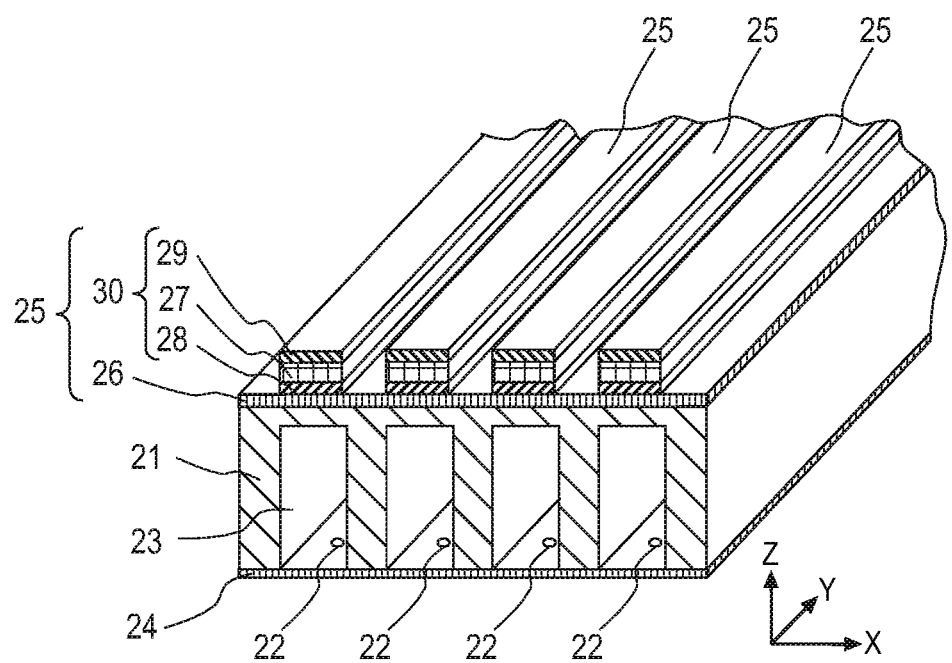
FIG. 7 is a schematic perspective view of a cross section of the liquid ejection head of FIG. 6, showing an exemplar structure thereof in greater detail.
Figure 8:
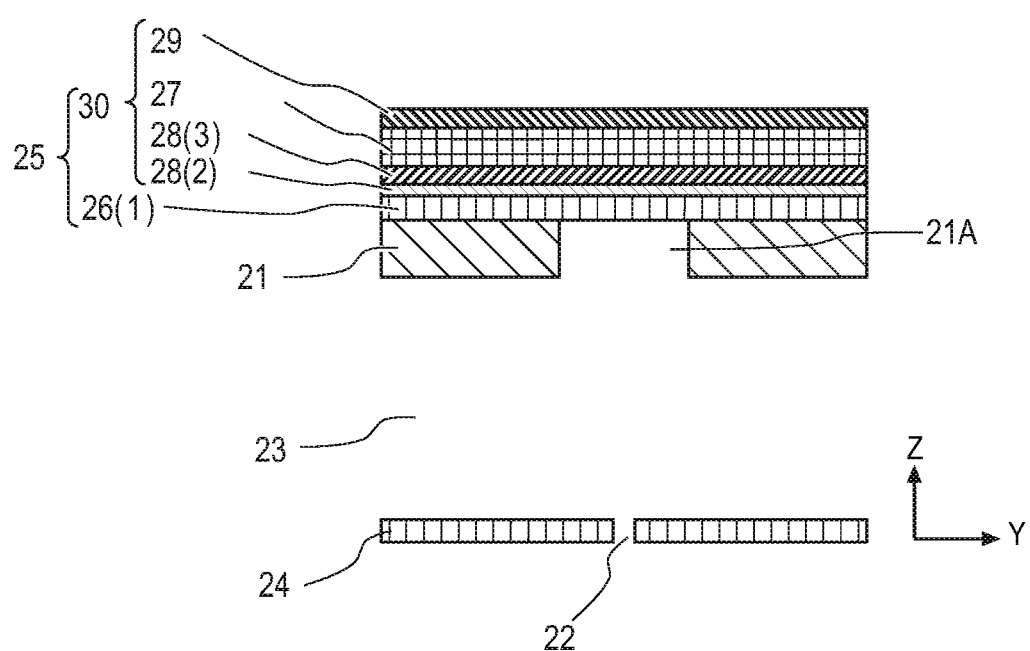
FIG. 8 is a schematic cross-sectional view of the liquid ejection head of FIG. 6, showing another exemplar structure thereof in greater detail.

A liquid ejection head according to the present disclosure can be a liquid ejection head that comprises a piezoelectric thin film as illustrated in FIGS. 6 through 8. More specifically, the illustrated liquid ejection head M comprises a liquid ejection head substrate 21, a plurality of liquid ejection orifices 22, a plurality of pressure chambers 23 and a plurality of actuator 25 arranged so as to correspond to the respective pressure chambers 23. By turn, the pressure chambers 23 are arranged so as to correspond to the respective liquid ejection orifices 22 and held in communication with the respective liquid ejection orifices 22. Each of the actuators 25 changes the volume of the liquid in the corresponding pressure chamber 23 by means of its vibrations and drives the liquid in the pressure chamber 23 to be ejected from the corresponding liquid ejection orifice 22. The liquid ejection orifices 22 are arranged on a nozzle plate 24 at regular intervals and the pressure chambers 23 are formed in the liquid ejection head substrate 21 so as to correspond to the respective liquid ejection orifices 22 and arranged in parallel with each other. Note that, while the liquid ejection orifices 22 are arranged on the lower surface side of the actuators 25 in this embodiment, they may alternatively be arranged on the lateral surface sides of the respective actuators 25.

Openings that correspond to the respective pressure chambers 23 are formed on the upper surface of the liquid ejection head substrate 21 and the actuators 25 are so arranged as to close the respective openings. Each of the actuators 25 comprises a vibration plate 26 which is commonly shared by all the actuators and a piezoelectric element 30 and the piezoelectric element 30 in turn comprises a piezoelectric thin film 27 and a pair of electrodes (a lower electrode 28 and an upper electrode 29). While the material of the vibration plate 26 is not subject to any particular limitations, it is preferably made of semiconductor such as Si, metal, a metal oxide or glass. The piezoelectric element 30 of each of the actuators 25 and the vibration plate 26 may be bonded to each other or otherwise put together or, alternatively, the lower electrode 38 and the piezoelectric thin film 30 of each of the actuators may directly be formed on the vibration plate 26, using the vibration plate 26 as substrate. Still alternatively, the vibration plate 26 may directly be formed on the liquid ejection head substrate 21.

Liquid to be used with a liquid ejection head according to the present disclosure may typically be ink. Thus, a liquid ejection head according to the present disclosure may typically be an inkjet recording head.

EXAMPLES

Now, the present disclosure will be described in greater detail below by way of examples and comparative examples. Note, however, that the examples that will be described hereinafter do not limit the scope of the present disclosure by any means. In the examples, cross sections of the coating films were observed through a scanning electron microscope ("Quanta FEG250", trade name, available from FEI) with an acceleration voltage of 10 kV. TSL-EBSD System (trade name, available from TSL Solutions) was employed to evaluate the electron backscatter diffraction of the samples of the examples.

(Example 1) Preparation of Coating Liquid Composition

The coating liquid composition of this example was prepared by dissolving niobium ethoxide, sodium ethoxide, barium di-i-propoxide and titanium n-butoxide into a solution obtained by adding ethyl acetoacetate, which is a stabilizer, to a mixture solvent of 2-methoxy ethanol, 3-methoxy methyl butanol and 2-ethylhexanoic acid and subsequently refluxing the prepared solution for about 8 hours. The molar ratio of the solution, namely 2-methoxy ethanol:3-methoxy methyl butanol:2-ethylhexanoic acid: ethyl acetoacetate:niobium ethoxide:sodium ethoxide: barium di-i-propoxide:titanium n-butoxide was made to be 12:8:3:1:0.95:0.95:0.05:0.05.

Figure 1A:
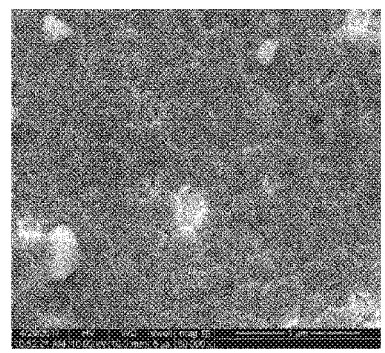
Figure 1B:
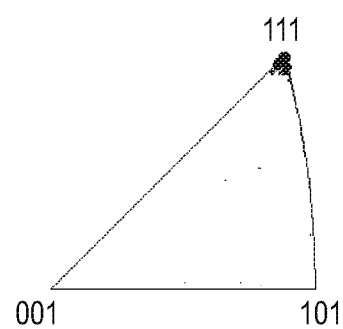
Figure 1C:
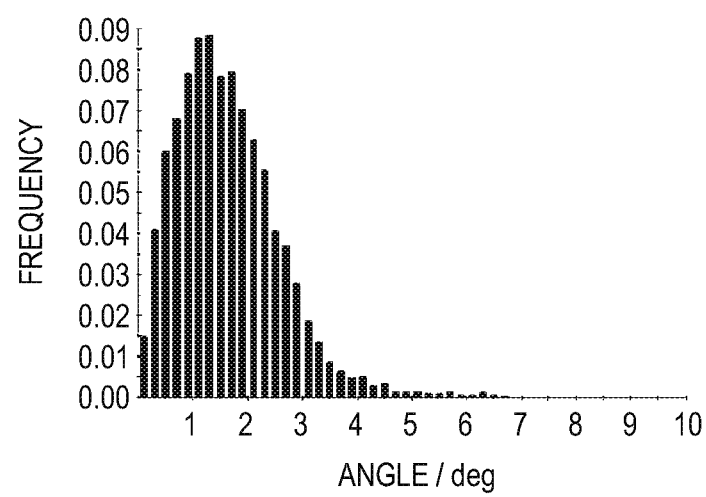
FIG. 1C shows the angular distribution of the (111) orientation of the film.

A film of the prepared coating liquid composition was formed on a Pt/SiO$_2$/Si substrate by spin coating. The Pt electrode was a (111) oriented film formed by sputtering. After heat-treating the film on a hot plate, whose temperature was set to be equal to 150° C., for 5 minutes in a drying step (Step 1), the film was heat-treated in a focused infrared heater at temperatures between 400 and 600° C. for 10 minutes in a temporary baking step (Step 2). The drying step and the temporarily baking step were repeated for once to 5 times and subsequently a baking step of baking the film at 1,000° C. for 10 minutes was executed (Step 3). The obtained film was observed through an SEM to see its profile and determine its film thickness and then evaluated for orientation by way of EBSD. The thickness of the obtained film rose as the number of repetitions of Steps (1) through (3) was increased. The film thickness was 70 nm per layer under the above conditions. In other words, the film thickness changed from 70 nm (once) to 350 nm (five times). FIG. 1A and FIG. 1B respectively show a surface SEM image and the inverse pole figure of the film having a film thickness of 70 nm, which was obtained by executing Steps (1) through (3) only once. The inverse pole figure of FIG. 1B proves concentration on the (111) plane. As a result of observing an orientation color map of the obtained film obtained by an EBSD measurement, it was found that the blue part that shows the (111) plane substantially occupied all the area of the color map. FIG. 1C shows the angular distribution of the (111) plane. The half width was about 1.8 degrees to prove a high degree of orientation. For the purpose of the present disclosure, the abundance ratio of the area that occupies the orientation color map within 5 degrees from (111) of the inverse pole figure obtained by an EBSD measurement is defined as the degree of (111) orientation. In FIG. 1B, the degree of (111) orientation is 90%, which proves that a film showing a high degree of (111) orientation was obtained.

The films showing different film thicknesses that were obtained by using different temporary baking temperatures were evaluated by way of EBSD. Table 1 shows the results of evaluations on the degrees of (111) orientation of the obtained films. When the film thickness is as small as 70 nm, films showing a high degree of (111) orientation were obtained regardless of temporary baking temperature. When the temporary baking temperature was as low as not higher than 450° C., the degree of (111) orientation fell as the film thickness rose and random orientation was observed when the film thickness was not less than 200 nm. When, on the other hand, the temporary baking temperature was not lower than 500° C., a high degree of (111) orientation was obtained even when the film thickness was as large as 350 nm. Although not shown in Table 1, films that stably showed a high degree of (111) orientation of not less than 95% were obtained when the film thickness was not more than 500 nm. When the film thickness was greater than 500 nm, on the other hand, there were instances where films that showed cracks and/or came off from substrates were produced after the baking step. The reason why films showing a high degree of (111) orientation were obtained when the temporary baking temperature was not lower than 500° C. probably lies in the detachment of the stabilizer from the metal alkoxides and the influence of the timing of the appearance of the crystal nuclei generation stage on the film orientation. Thus, it may be safe to assume that, when the temporary baking temperature is not lower than 500° C., the stabilizer is detached from the metal alkoxides and the generation of crystal nuclei is promoted so that epitaxial growth along the (111) plane of the Pt electrode of the base substrate takes place to make it possible to obtain (111) oriented films.

Thus, the temporary baking step should be executed at temperatures lower than 500° C. when the film thickness of the prepared coating film is less than 200 nm, whereas the temporary baking step should be executed at temperatures between 500 and 700° C. when the film thickness of the prepared coating film is between 200 and 500 nm. Then, a (111) oriented piezoelectric film can be obtained by repeating Steps (1) through (4) until the coating film comes to show the desired film thickness.

TABLE 1

| degree of (111) orientation | film thickness after drying and temporary baking | | | | |
|---|---|---|---|---|---|
| | | 70 nm | 140 nm | 210 nm | 280 nm | 350 nm |
| temporary baking temperature | 400° C. | 95% | 65% | 20% | 13% | 3% |
| | 450° C. | 95% | 75% | 35% | 25% | 10% |
| | 500° C. | 95% | 98% | 99% | 99% | 98% |
| | 600° C. | 90% | 99% | 98% | 98% | 97% |

(Example 2) Film Thickness Raising

Figure 2A:
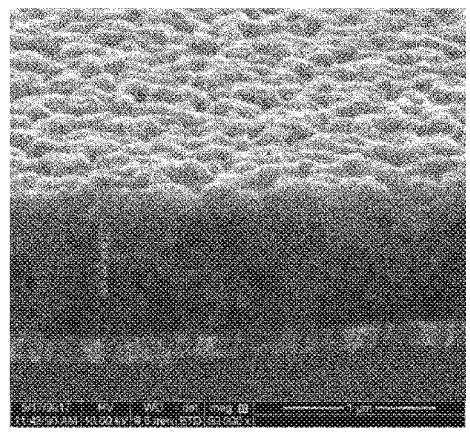
FIG. 2A is an SEM image from an oblique direction of a cross section of the film obtained in Example 2 and FIG. 2B is an inverse pole figure of the film.
Figure 2B:
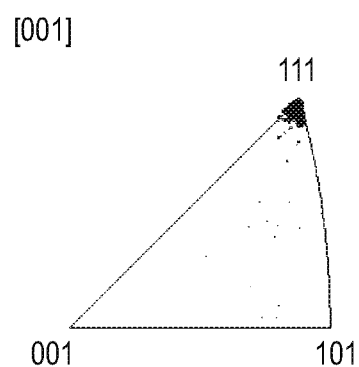

The thickness of the (111) oriented film obtained in Example 1 was raised by repeating the above-described steps. More specifically, 600° C. was selected for the temporary baking temperature and Steps (1) through (3) were repeated to make the film thickness equal to 350 nm and then the film was baked at 1,000° C. for 10 minutes. The above-described series of steps were repeated for three times to raise the film thickness to not less than 1 FIG. 2A is an SEM image as observed from an oblique direction of a cross section of the film obtained in Example 2 and FIG. 2B is an inverse pole figure of the film. FIG. 2A proved that a film having a film thickness of 1,050 nm had been obtained. FIG. 2B proved that a highly (111) oriented film had been obtained. The degree of (111) orientation was equal to 95%. It was also found by observing the orientation color map that a highly (111) oriented film had been obtained. Thus, when a film was additionally formed on the (111) plane of the oriented NNBT film by executing the above-described steps, an epitaxial growth took place along the (111) plane of the NNBT film that served as base and the orientation of the film was maintained. Therefore, as a result, a (111) oriented piezoelectric film having a desired film thickness was obtained by repeating Steps (1) through (3). Although an instance where a single temporary baking condition for raising the film thickness is selectively used is described above, the film thickness can be raised, while maintaining the current degree of orientation, under any of the conditions for raising the degree of orientation as shown in Table 1 by repeating the steps.

(Example 3) Compositional Range for Obtaining Oriented Film

Coating liquid compositions were prepared by following the process for preparing a coating liquid composition as described above for Example 1 with varying molar ratios of the sodium niobate (NN) component and the barium titanate (BT) component that were made to vary within the range between 0.99:0.01 and 0:1.0 as shown in Table 2. Then, piezoelectric films having a film thickness of 70 nm were produced from the prepared coating liquid compositions with a temporary baking operation executed at a temperature of 600° C. and a baking operation executed once at a temperature of 1,000° C., which were the same as those of Example 1. The obtained piezoelectric films were subjected to EBSD evaluations. Table 2 shows the results of evaluations of the degrees of orientation of the obtained piezoelectric films. It will be seen from Table 2 that the degrees of orientation were not less than 80% for the piezoelectric films whose molar ratios of the BT components were not greater than 40 mol % but the degree of orientation fell as the molar ratio of the B component rose. The above results proved that a degree of orientation of not less than 80% can be obtained when the composition ratio of the sodium niobate component and the barium titanate component is between 0.99:0.01 and 0.60:0.40 in terms of molar ratio. Additionally, it is possible to form a piezoelectric film, maintaining the degree of orientation, if the ratio of sodium niobate and barium titanate is between 1:0.8 and 1:1.2.

TABLE 2

| NN(mol %) | 99 | 95 | 90 | 85 | 80 | 75 | 60 | 50 | 40 | 20 | 0 |
| BT(mol %) | 1 | 5 | 10 | 15 | 20 | 25 | 40 | 50 | 60 | 80 | 100 |
| degree of orientation | 99 | 99 | 98 | 98 | 95 | 91 | 80 | 41 | 18 | 5 | 3 |

Figure 3:
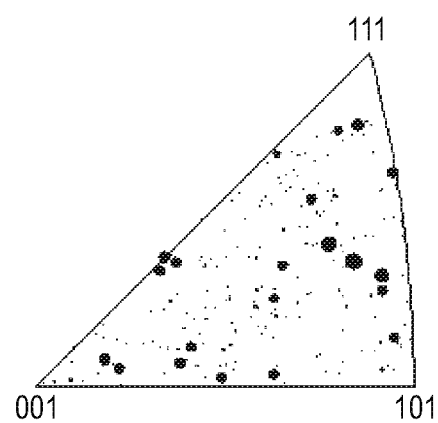
FIG. 3 is an inverse pole figure of the film obtained in Comparative Example 1.

(Comparative Example 1) Instance where Coating Liquid Composition was Used with a Different Stabilizer A coating liquid composition was prepared as in Example 1 except that acetyl acetone was employed for the stabilizer. A piezoelectric film having a film thickness of 70 nm was produced by using the prepared coating liquid composition and applying it on a (111) oriented Pt/SiO$_2$/Si substrate by spin coating, drying the applied coating liquid composition at 150° C., temporarily baking the applied coating liquid composition at 600° C. and baking the temporarily baked coating liquid composition at 1,000° C. only once. The obtained film was subjected to an EBSD evaluation. FIG. 3 shows the obtained inverse pole figure. The obtained film had randomly been oriented. In other words, an oriented film could not be obtained by using acetyl acetone for the stabilizer.

(Comparative Example 2) Instance where No Pt Base was Provided

Figure 4:
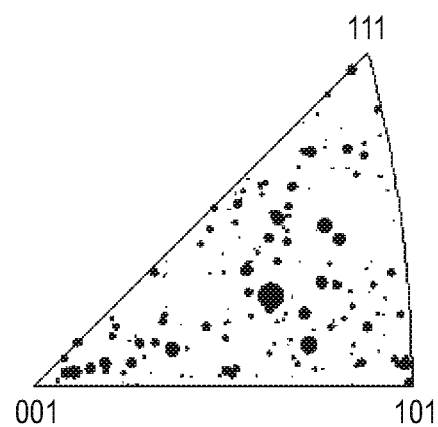
FIG. 4 is an inverse pole figure of the film obtained in Comparative Example 2.

A coating liquid composition same as the one used in Example 1 was applied onto an SiO$_2$/Si substrate by spin coating and the applied coating liquid composition was dried at 150° C. Subsequently, the applied coating liquid composition was temporarily baked at 600° C. and baked at 1,000° C. only once to produce a piezoelectric film having a film thickness of 70 nm. The obtained film was subjected to an EBSD evaluation. FIG. 4 shows the obtained inverse pole figure. The obtained film had randomly been oriented. In other words, an oriented film could not be obtained when the base member was not provided with (111) oriented Pt.

INDUSTRIAL APPLICABILITY

As described above, according to the present disclosure, an NNBT film oriented along the (111) plane can be obtained by way of a film forming process that allows an epitaxial growth to take place and uses a Pt electrode base member. Then, as a result, the present disclosure can provide an NNBT film showing a high piezoelectric constant.

While the present disclosure has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2018-188389, filed Oct. 3, 2018, which is hereby incorporated by reference herein in its entirety.

What is claimed is:

1. An oriented piezoelectric film comprising perovskite type crystals expressed by formula (1) shown below:

$$(1-x)\text{NaNbO}_3\text{-}x\text{BaTiO}_3 \quad (0.01 \leq x \leq 0.40) \tag{1}$$

wherein the oriented piezoelectric film is (111) oriented in pseudocubic crystal notation, the abundance ratio of (111) orientation as observed by the electron backscatter diffraction (EBSD) method being not less than 80% on the film surface, and the angular dispersion of (111) orientation being within 5 degrees in the inverse pole figure in the normal direction of the film.

2. A piezoelectric element comprising:

a lower electrode;

an oriented piezoelectric film comprising perovskite type crystals expressed by formula (1) shown below:

$$(1-x)\text{NaNbO}_3\text{-}x\text{BaTiO}_3 \quad (0.01 \leq x \leq 0.40) \tag{1}$$

wherein the oriented piezoelectric film is (111) oriented in pseudocubic crystal notation, the abundance ratio of (111) orientation as observed by the electron backscatter diffraction (EBSD) method being not less than 80% on the film surface, the angular dispersion of (111) orientation being within 5 degrees in the inverse pole figure in the normal direction of the film; and an upper electrode, the lower electrode being laid on the oriented piezoelectric film and the oriented piezoelectric film being laid on the upper electrode.

3. The piezoelectric element according to claim 2, wherein the lower electrode is a (111) oriented Pt electrode.

* * * * *